United States Patent [19]

Hsu

[11] 4,276,688
[45] Jul. 7, 1981

[54] METHOD FOR FORMING BURIED CONTACT COMPLEMENTARY MOS DEVICES

[75] Inventor: Sheng T. Hsu, Lawrenceville, N.J.

[73] Assignee: RCA Corporation, New York, N.Y.

[21] Appl. No.: 113,505

[22] Filed: Jan. 21, 1980

[51] Int. Cl.³ .................. H01L 21/86; H01L 21/88
[52] U.S. Cl. ............................ 29/571; 29/578;
   29/590; 148/1.5; 148/175; 148/187; 156/657;
   156/659.1; 156/662; 357/4; 357/23; 357/42;
   357/49; 427/88; 427/91; 427/126.1
[58] Field of Search .............. 148/1.5, 175, 187;
   29/571, 577 C, 578, 590; 427/88, 91, 126.1,
   255.4; 357/4, 23, 49, 42; 156/687, 659.1, 662,
   653

[56] References Cited

U.S. PATENT DOCUMENTS

| 3,753,774 | 8/1973 | Veloric ........................... 357/23 X |
| 3,958,266 | 5/1976 | Athanas .............................. 357/23 |
| 3,990,056 | 11/1976 | Luisi et al. ...................... 340/173 R |
| 4,057,824 | 11/1977 | Woods ............................. 357/4 X |
| 4,102,733 | 7/1978 | De La Moneda ................ 29/571 X |
| 4,109,372 | 8/1978 | Geffken ............................. 29/571 |
| 4,125,854 | 11/1978 | McKenny et al. .................. 357/41 |
| 4,151,631 | 5/1979 | Klein ................................ 29/571 |
| 4,169,746 | 10/1979 | Ipri et al. .......................... 148/175 |

OTHER PUBLICATIONS

Rideout, V. L., "Reducing Sheet Resistance . . . Integrated Circuits", I.B.M. Tech. Discl. Bull., vol. 17, No. 6, Nov. 1974, pp. 1831-1833.

Primary Examiner—L. Dewayne Rutledge
Assistant Examiner—W. G. Saba
Attorney, Agent, or Firm—Birgit E. Morris; D. S. Cohen; Lawrence P. Benjamin

[57] ABSTRACT

A method for fabricating a complementary MOS device, applicable to either silicon-on-sapphire or bulk silicon, is described wherein a buried contact is formed that is comprised of a region of doped silicon, a layer of $MoSi_2$, a thin layer of Mo and a layer of doped polycrystalline silicon.

7 Claims, 10 Drawing Figures

METHOD FOR FORMING BURIED CONTACT COMPLEMENTARY MOS DEVICES

BACKGROUND OF THE INVENTION

This invention relates to semiconductor processing and more particularly to a method for forming improved buried contacts in complementary MOS devices.

MOS devices arranged in complementary symmetry circuit configuration (hereinafter referred to as CMOS devices) are highly desirable to the design engineer due to the inherent noise immunity that they provide and the low power requirements associated therewith. However, as the density of the integrated circuit CMOS device on a given size chip is increased, the device size becomes so small that the contact area for the individual devices becomes disproportionately large and occupies a larger percentage of the chip real estate than is desired. Thus, if the contact area may be made smaller, the designer now has the opportunity to provide the chip with a higher density of CMOS devices.

The buried contact may be defined as a contact scheme which provides a direct connection between two polycrystalline silicon (polysilicon) layers or between a polysilicon layer and a layer of silicon with no appreciable penalty for either the misalignment or the junction formed at the point of connection. Where buried contacts are used in certain circuit configurations, that is when doped polysilicon lead lines are used with n-channel bulk silicon MOS devices, few difficulties are encountered since the bulk silicon and polysilicon lines are traditionally doped with n-type impurities. However, when processing CMOS devices where both n-channel and p-channel devices are used, there are no completely satisfactory prior art methods of interconnecting the devices with doped buried contacts without encountering the formation of an objectionable PN junction. This is due principally to the fact that regardless of the doping of the polysilicon line, one end of the line is connected to an N channel device while the other end terminates at a P channel device. For example, if an N-doped polysilicon line were used as an interconnect, N-P junction would be formed where the line terminated at the p-channel device. Similarly, when using a p-doped polysilicon line as the interconnection between a p-channel and an n-channel device, a PN junction would be formed between the interconnect and the n-channel device.

In a copending application filed by A. Dingwall on Oct. 3, 1978, Ser. No. 948,103 entitled "FIVE TRANSISTOR CMOS MEMORY CELL INCLUDING DIODES" and assigned to the same assignee as the subject application, the author acknowledges the presence of the diodes and devises a circuit which includes the diodes. One feature of the circuit is that there is sufficient drive to overcome the inherent voltage drop which may appear across the diodes.

In another application filed by D. Tanguay, et al. on Feb. 27, 1978, Ser. No. 881,255 entitled "BURIED CONTACT FOR COMPLEMENTARY MOS DEVICES" and assigned to the same assignee as the subject application. The inventors therein recognize the formation of an undesirable junction and, after the formation thereof provide another processing step to short circuit the undesired junction.

Still another pending application relating to the improvement of buried contacts is present in a pending application filed by C. E. Weitzel, et al. on Mar. 17, 1978, Ser. No. 887,724 entitled "LOW SURFACE RESISTANCE MOS/FET DEVICE AND METHOD OF MAKING SAME" in which the authors, in an endeavor to anticipate the possible formation of an undesired junction, completely silicide the surface of the area of the source and drain regions, so that when a subsequent doped polysilicon line is terminated thereon the low surface resistance presented by the silicided area will minimize the effect of the junction that might be formed.

SUMMARY OF THE INVENTION

A novel process is described for forming a CMOS device wherein selected areas of the surface of the device are chosen for forming a low resistance silicide thereon which allows for higher packing densities.

DETAILED DESCRIPTION OF THE DRAWINGS

While the following exegesis will be presented in terms of using sapphire as an insulative substrate or carrier, I do not wish to be so limited. Those skilled in the art will readily recognize that when the expression sapphire or silicon-on-sapphire (SOS) appears, it is meant to also include the use of spinel or monocrystalline beryllium oxide as the substrate.

Figure 1:
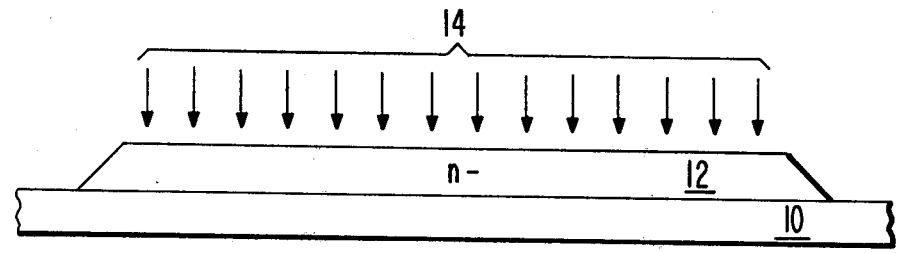
FIGS. 1–9 are taken in cross section to illustrate the various steps in the process of forming the CMOS device of the subject invention.

Referring now to FIG. 1, there is shown the first of the steps in the formation of my device wherein an epitaxial layer of monocrystalline silicon (not shown) is grown over the entire surface of sapphire substrate 10 to a thickness of about 6,000 angstroms ±500 angstroms in a well known manner. The layer of silicon may initially be grown having the n-type conductivity shown or may be appropriately doped after a silicon island has been formed. Island 12 is formed by first growing a masking oxide over the entire epitaxially grown layer of silicon and then providing the masking oxide with a patterned layer of photoresist to define the boundaries of the island. The masking oxide ($SiO_2$) is etched using a buffered Hydrofluoric (HF) acid solution. After etching those portions of the layer of $SiO_2$ not covered by the pattern of the photoresist, the photoresist is removed and the now etched layer of $SiO_2$ is used as a mask in order to etch the epitaxially grown silicon. This is accomplished using a buffered potassium hydroxide (KOH) solution.

Figure 2:
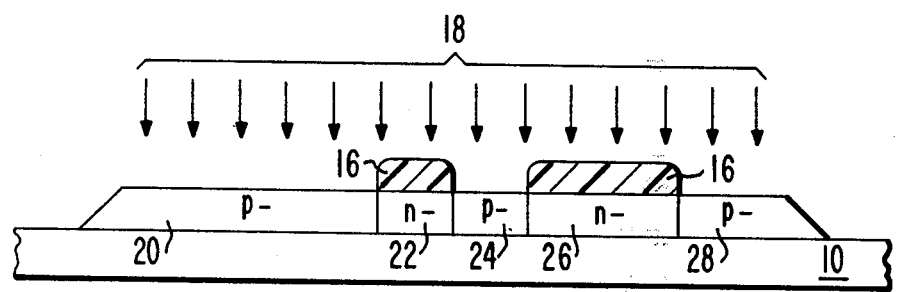
Figure 3:
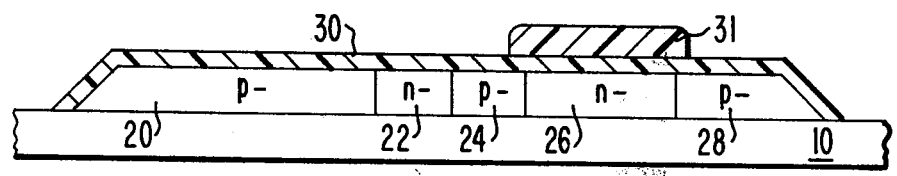

Having defined island 12, all oxide masking material is removing using an HF solution and, if necessary, island 12 is appropriately doped with n-type conductivity modifiers (Phosphorous) as indicated by arrows 14. Thereafter, as shown in FIG. 2, a layer of patterned photoresist material 16 is formed on island 12 in a well known manner and conductivity modifiers (Boron), as indicated by arrows 18, are implanted into island 12 forming p-type regions 20, 24 and 28. The remaining n-type regions are designated as 22 and 26 respectively. Masking material 16 is then removed and a layer of channel oxide 30 is grown over island 12 to a thickness of about 500–600 angstroms. This operation may, typically, be carried on at a temperature of about 900°–950° C. in steam and hydrochloric acid. After the formation of channel oxide 30, another layer of patterned photoresist 31 is formed over region 26 as shown in FIG. 3. This step is utilized in order to remove the exposed portion of channel oxide 30. This may be accomplished with a buffered HF solution. The resulting structure provides n-type region 26 with a layer of channel oxide 30.

Figure 4:
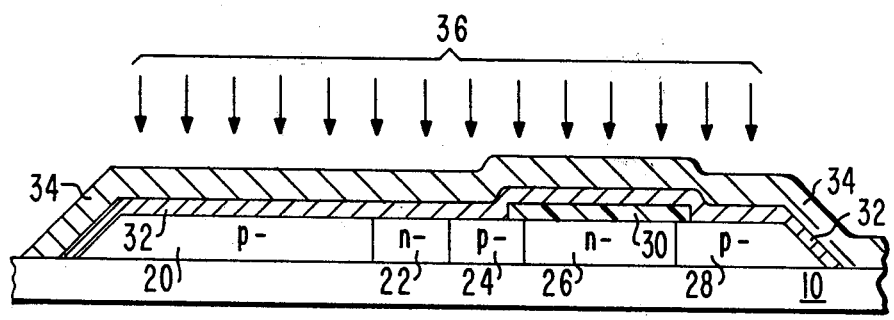

As shown in FIG. 4, a layer of molybdenum (Mo) 32 having a thickness ranging from about 100–400 angstroms is deposited over the structure and over all of the exposed surfaces. Typically, this may be done by sputtering the Mo while maintaining the substrate at a temperature of about 200° C. The next step after the formation of the Mo layer 32 is the deposition of a layer of polysilicon 34 which may be done by the pyrolytic decomposition of a silicon bearing material such as silane ($SiH_4$) at a temperature of about 600–700° C. for a sufficient period of time to form the polysilicon to a thickness of about 5,000–6,000 angstroms. Thereafter, the polysilicon layer 34 is doped with n-type conductivity modifiers as shown symbolically by arrows 36.

Figure 5:
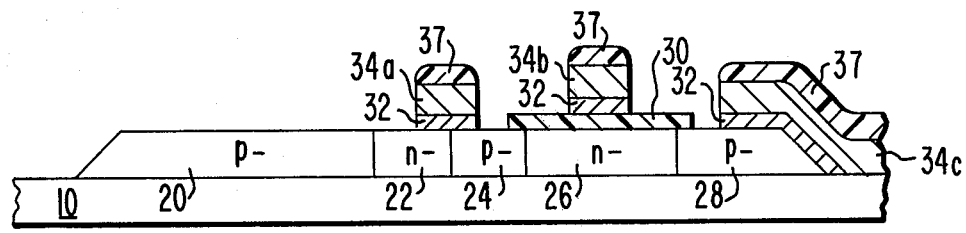

Referring now to FIG. 5, it will be seen that after the formation and the doping of polysilicon layer 34, the device is now provided with a layer of patterned masking material 37 after which the exposed portions of doped polysilicon layer 34 is etched using a KOH solution to define regions 34a, 34b and 34c. It should be noted that the same KOH solution utilized to etch the unmasked portions of the doped polysilicon layer 34 will also remove the portions of the molybdenum layer thereunder resulting in the structure shown in FIG. 5.

Figure 6:
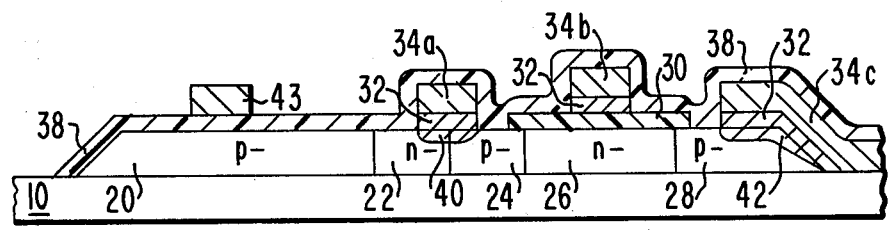

The next step in the processing of my device, as shown in FIG. 6, requires the formation of a second layer of gate oxide material 38, which as before, may be grown at a temperature of about 900°–950° C. in steam and hydrochloric acid for a sufficient period of time to have a thickness ranging from about 500–600 angstroms. It should be noted that as a result of using an elevated temperature of about 900°–950° C., that a desirable molybdenum disilicide ($MoSi_2$) will occur wherever the molybdenum layer 32 is in direct contact with the layer of silicon. The result is that silicided area 40 is formed under doped polysilicon region 34a and silicided area 42 is formed under doped polysilicon area 34c. These silicided areas 40 and 42 form regions of high conductivity by reason of their low resistivity and the net result is a low resistance path between region 22 having an n-type conductivity and region 24 having a p-type conductivity and between n-doped polysilicon region 34a and the p-doped region 24. Similarly, silicided area 42 provides a low resistance path between n-doped polysilicon lead line 34c and p-type region 28. Thereafter, to complete the device shown in FIG. 6, a second layer of polysilicon (not shown) is formed over the entire surface of the structure and is masked and etched to form gate member 43.

Figure 7:
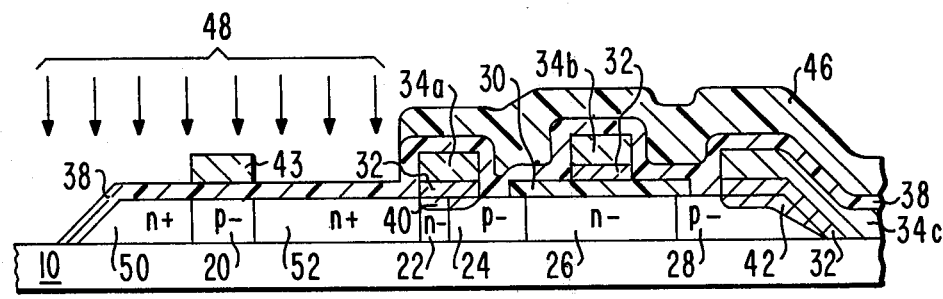
Figure 8:
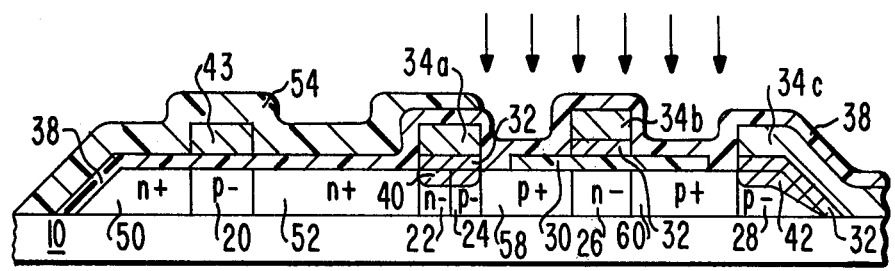

Referring now to FIG. 7 for the further processing of my device, it will be seen that the n-channel device is now formed. This is accomplished by providing the structure with a layer of photoresist layer 46 over that portion of the structure wherein the p-channel device will be formed and, thereafter, subjecting the unmasked portions to an ion implantation step. In the device shown, n-type conductivity modifiers are introduced into region 20 to form a self-aligned n-channel device. The ion implantation, shown symbolically by arrows 48, is provided in order to form active areas 50 and 52 and, at the same time, appropriately dope gate member 43 with n-type conductivity modifiers. Typically, phosphorous is used to provide n-type modifiers. Thereafter, as shown in FIG. 8, photoresist material 46 is removed and a layer of a similar type photoresist material 54 is deposited over the now formed n-channel section after which the p-channel section of the device is formed by ion implantation (arrows 56). Implantation with Boron forms active regions 58 and 60 using gate member 34b as a means for accurately aligning the channel region of the p-channel device.

The final steps require the removal of mask layer 54 and the growth of a layer of field oxide 62 to cover the entire device. This is followed by another masking step (not shown) followed by an etching step to form contact openings followed by the deposition of aluminum contacts 64, 66, 68 and 70 in a well known manner.

Figure 9:
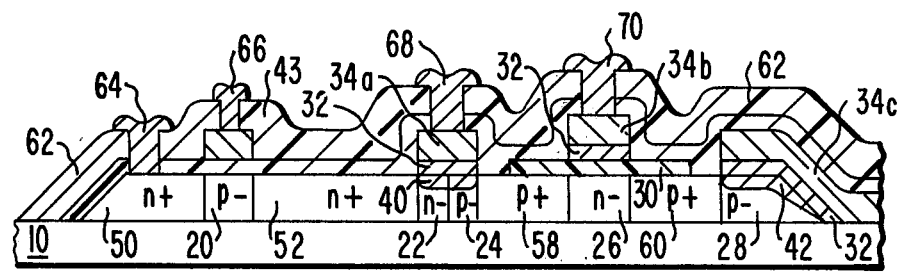
Figure 10:
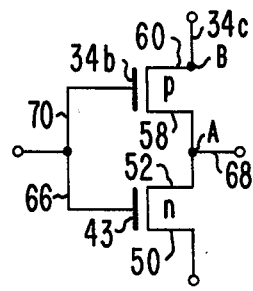
FIG. 10 is the schematic representation of a completed CMOS device.

Thus, Applicant has provided a process for forming CMOS devices wherein silicided buried contacts provide low resistance paths between abutting or adjacent regions of opposite conductivity. Comparing the structure as shown in cross section in FIG. 9 with the schematic representation as shown in FIG. 10, it will be seen that there is provided a CMOS device wherein the buried contact a Node A (FIG. 10) comprises n-doped region 34a, molybdenum layer 32 and the $MoSi_2$ region 40, while Node B (FIG. 10) is comprised of p-region 28, $MoSi_2$ region 42, molybdenum region 32 and n-doped lead line 34c. All other numbered elements in FIG. 10 correspond similarly numbered elements in FIGS. 1–9.

While I have described the processing of a buried contact on a CMOS/SOS device, it should now be obvious to those skilled in the art that the method described herein may be readily adapted to the processing of a bulk silicon CMOS device without departing from the inventive concept. For example, in utilizing the process of my invention to form a CMOS device in bulk silicon, one would commence the processing with an n-type silicon body. Thereafter, the processing would proceed using the same processing steps as outlined in FIGS. 2–9 wherein regions 20, 24 and 28 would be p-wells formed in the n-type silicon body.

What is claimed is:

1. A method of fabricating a CMOS device having buried contacts therein, comprising the steps of:
    providing a body of semiconductor material of a first conductivity type, the body having a common boundary surface;
    modifying regions of the body of semiconductor material, at the common boundary surface, to a second opposite conductivity type, to form alternate regions of adjacent first and second conductivity type regions;
    providing one first conductivity type region with a first layer of gate insulator;
    depositing a layer of refracting metal on the exposed portions of the common boundary surface and the layer of gate insulator material;
    growing a layer of doped polycrystalline silicon on the deposited metal;
    providing the layer of doped polycrystalline silicon with a patterned layer of photoresist and etching the unmasked portion of the polycrystalline silicon and metal layer thereunder to form a doped polycrystalline silicon gate electrode on the layer of gate insulator over a first conductivity type region;
    growing a second gate insulator layer on the body of semiconductor material at a given temperature sufficiently high to form a first buried contact at a junction of abutting first and second conductivity type regions and a second buried contact at a second conductivity type region;

forming a second doped polysilicon gate member on the second layer of gate insulator over a second conductivity type region;

providing a portion of the body with a layer of masking material and ion implanting second conductivity type active areas in the unmasked portion of the body;

removing the masking material from the previously masked portion of the body;

providing the previously unmasked portion with a layer of masking material and ion implanting a first conductivity type material in the unmasked portion of the body to form active areas therein;

removing the masking material from the masked portion of the semiconductor body;

providing the body with a layer of insulating material and forming contact openings therein; and depositing metallic leads in the contact openings, one lead in direct ohmic connection with one active area of a first conductivity type, another lead in ohmic contact with the first and second doped polysilicon gate members and a further lead in ohmic contact with the polycrystalline silicon region adjacent the first buried contact.

2. The method of claim 1, wherein:

the body of semiconductor material is an island of silicon located on an insulative substrate; and the substrate is selected from the group consisting of sapphire, spinel and monocrystalline beryllium oxide.

3. The method of claim 2, wherein:

the second layer of gate insulator is grown at a temperature of about 900°–950° C. to form a silicided area of the first and second buried contact regions.

4. The method of claim 3, wherein:

the refractory metal sputtered on the exposed portions of the common boundary surface is molybdenum; and molybdenum disilicide is formed during the formation of the second layer of gate insulator.

5. The method of claim 1, wherein:

the body of semiconductor material is bulk silicon of the first conductivity type.

6. The method of claim 5, wherein:

the second layer of gate insulator is grown at a temperature of about 900°–950° C. to form a silicided area at the first and second buried contact regions.

7. The method of claim 6, wherein:

the refractory metal sputtered on the exposed portions of the common boundary surface is molybdenum; and molybdenum disilicide is formed during the formation of the second layer of gate insulator.

* * * * *

UNITED STATES PATENT AND TRADEMARK OFFICE
CERTIFICATE OF CORRECTION

PATENT NO. : 4,276,688

DATED : July 7, 1981

INVENTOR(S) : Sheng Teng Hsu

It is certified that error appears in the above-identified patent and that said Letters Patent is hereby corrected as shown below:

Column 1, line 1, change "configuration" to --configurations--.

Claim 1, line 56, change "refracting" to --refractory--.

Signed and Sealed this

Twenty-ninth Day of September 1981

[SEAL]

Attest:

GERALD J. MOSSINGHOFF

Attesting Officer     Commissioner of Patents and Trademarks